(12) United States Patent
Hanawa et al.

(10) Patent No.: US 11,158,523 B2
(45) Date of Patent: Oct. 26, 2021

(54) SUBSTRATE DRYING METHOD AND SUBSTRATE DRYING APPARATUS

(71) Applicant: SCREEN Holdings Co., Ltd., Kyoto (JP)

(72) Inventors: Yosuke Hanawa, Kyoto (JP); Yuta Sasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/639,154

(22) PCT Filed: Jun. 19, 2018

(86) PCT No.: PCT/JP2018/023259
§ 371 (c)(1),
(2) Date: Feb. 14, 2020

(87) PCT Pub. No.: WO2019/053988
PCT Pub. Date: Mar. 21, 2019

(65) Prior Publication Data
US 2020/0234980 A1    Jul. 23, 2020

(30) Foreign Application Priority Data

Sep. 15, 2017  (JP) .............................. JP2017-177391

(51) Int. Cl.
*H01L 21/67* (2006.01)
*F26B 5/06* (2006.01)
*H01L 21/02* (2006.01)
(52) U.S. Cl.
CPC .......... *H01L 21/67034* (2013.01); *F26B 5/06* (2013.01); *H01L 21/02041* (2013.01)
(58) Field of Classification Search
CPC . H01L 21/67034; H01L 21/02041; F26B 5/06
(Continued)

(56) References Cited

U.S. PATENT DOCUMENTS 6,193,798 B1 * 2/2001 Sumnitsch .......... H01L 21/6715
118/52
7,029,538 B2 * 4/2006 Ono .................. H01L 21/67034
134/21
(Continued)

FOREIGN PATENT DOCUMENTS

EP    1975979 B1 * 8/2012 ......... H01L 21/6715
JP    2002-012892 A    1/2002
(Continued)

OTHER PUBLICATIONS

International Search Report dated Sep. 4, 2018 in corresponding PCT International Application No. PCT/JP2018/023259.
(Continued)

*Primary Examiner* — Stephen M Gravini
(74) *Attorney, Agent, or Firm* — Ostrolenk Faber LLP (57) ABSTRACT

A processing liquid containing a sublimable material is supplied to a front surface of a substrate to which a liquid adheres to form a liquid film. The liquid film is solidified into a solidified body. Nitrogen gas is supplied to the solidified body formed on the front surface of the substrate so that the flow rate thereof per unit area is constant over the entire surface of the substrate. The solidified body is sublimated uniformly over the entire surface of the substrate, and a gas-solid interface of the solidified body moves in a direction perpendicular to the front surface of the substrate. This precludes protrusions of a pattern from being pulled by the movement of the gas-solid interface of the solidified body, whereby the front surface of the substrate is dried well while the collapse of the pattern formed on the front surface of the substrate is prevented.

10 Claims, 6 Drawing Sheets

(58) Field of Classification Search
USPC .......................................................... 34/404
See application file for complete search history.

(56) References Cited

U.S. PATENT DOCUMENTS

| | | | | |
|---|---|---|---|---|
| 8,075,731 | B2 | 12/2011 | Miya | .................. 156/345.33 |
| 9,213,242 | B2* | 12/2015 | Uozumi | ............. H01L 21/6715 |
| 9,536,797 | B2* | 1/2017 | Igarashi | ................. H01L 22/12 |
| 10,153,181 | B2* | 12/2018 | Sasaki | ............. H01L 21/67028 |
| 10,460,961 | B2* | 10/2019 | Nagashima | ....... H01L 21/02052 |
| 10,699,920 | B2* | 6/2020 | Hanawa | ........... H01L 21/67051 |
| 10,707,099 | B2* | 7/2020 | Breingan | .......... H01L 21/67051 |
| 10,835,908 | B2* | 11/2020 | Kaneko | ................. B05B 12/14 |
| 10,964,558 | B2* | 3/2021 | Hashimoto | ....... H01L 21/67034 |
| 2009/0162547 | A1* | 6/2009 | Sawada | ............. H01L 21/6715 |
| | | | | 427/240 |
| 2019/0295865 | A1* | 9/2019 | Hanawa | ........... H01L 21/67075 |
| 2020/0234980 | A1* | 7/2020 | Hanawa | ........... H01L 21/67034 |
| 2020/0381269 | A1* | 12/2020 | Fujiwara | .......... H01L 21/67051 |
| 2020/0411309 | A1* | 12/2020 | Otsuji | .............. H01L 21/68764 |
| 2021/0016331 | A1* | 1/2021 | Ueda | ................ H01L 21/67034 |

FOREIGN PATENT DOCUMENTS

| | | | | |
|---|---|---|---|---|
| JP | 2005-142461 | A | | 6/2005 |
| JP | 2008-246450 | A | | 10/2008 |
| JP | 2009-111219 | A | | 5/2009 |
| JP | 2010-192878 | A | | 9/2010 |
| JP | 2010-199261 | A | | 9/2010 |
| JP | 4760516 | B2 * | 8/2011 | ......... H01L 21/6715 |
| JP | 4988510 | B2 | | 8/2012 |
| JP | 5153296 | B2 | | 2/2013 |
| JP | 5153296 | B2 * | 2/2013 | ....... H01L 21/67051 |
| JP | 5373429 | B2 | | 12/2013 |
| JP | 2014-011426 | A | | 1/2014 |
| JP | 2019054112 | A * | 4/2019 | ............... F26B 5/06 |
| JP | 2020004908 | A * | 1/2020 | ............. B08B 3/041 |
| KR | 101011306 | B1 * | 1/2011 | ....... H01L 21/67051 |
| WO | WO-2019053988 | A1 * | 3/2019 | ....... H01L 21/02041 |

OTHER PUBLICATIONS

Written Opinion dated Sep. 4, 2018 in corresponding PCT International Application No. PCT/JP2018/023259.
Office Action dated Jun. 17, 2019 in corresponding Taiwanese Patent Application No. 107123096, along with a partial English translation based on a Japanese translation.
Notice of Reasons for Refusal dated Feb. 9, 2021 in corresponding Japanese Patent Application No. 2017-177391 with English translation obtained from Global Dossier.
Notification of Reason for Refusal dated May 13, 2021 in corresponding Korean Patent Application No. 10-2020-7007377 with English translation obtained from Global Dossier.
Notice of Reasons for Refusal dated Apr. 20, 2021 in corresponding Japanese Patent Application No. 2017-177391 with English translation obtained from Global Dossier.
Decision of Refusal dated Jul. 13, 2021 in corresponding Japanese Patent Application No. 2017-177391 with English translation obtained from Global Dossier.

* cited by examiner

SUBSTRATE DRYING METHOD AND SUBSTRATE DRYING APPARATUS

CROSS-REFERENCE TO RELATED APPLICATIONS

The present application is a 35 U.S.C. §§ 371 national phase conversion of International Application No. PCT/JP2018/023259, filed Jun. 19, 2018, which claims priority to Japanese Patent Application No. 2017-177391, filed Sep. 15, 2017, the contents of both of which are incorporated herein by reference. The PCT International Application was published in the Japanese language.

TECHNICAL FIELD

The present invention relates to a substrate drying method and a substrate drying apparatus which remove a liquid adhering to a surface of a thin plate-like precision electronic substrate (hereinafter referred to simply as a "substrate") such as a semiconductor wafer to dry the substrate.

BACKGROUND ART

Various liquid processes including a cleaning process using a chemical liquid, a rinsing process using DIW (deionized water), and the like are performed on a substrate in the process steps of manufacturing an electronic component such as a semiconductor device. A drying process for removing a liquid remaining on the substrate is required after the completion of the liquid processes. For example, a spin-drying process is typically performed which rotates a substrate at a high speed to spin off the liquid adhering to the substrate by centrifugal force, thereby drying the substrate.

However, if a liquid adhering to a substrate is removed by a conventional general drying process, the collapse of a pattern formed on a surface of the substrate becomes a problem. The collapse of a pattern is a phenomenon in which protrusions of the pattern having the protrusions and depressions are pulled by the surface tension of the liquid to fall down. In particular, the aspect ratio of the protrusions (the ratio between the height and the width of the protrusions) of the pattern is increasing in recent years, which in turn makes the pattern liable to collapse. It is hence an important technical challenge to prevent the collapse of patterns during the drying process.

To solve the problem, for example, Patent Document 1 proposes a technique in which a liquid film of deionized water or the like is formed on a substrate and solidified by cooling (or frozen), and thereafter nitrogen gas at a low temperature is supplied to the frozen film of deionized water (an ice film) to sublimate the frozen film, thereby performing a drying process. A phase transition of the frozen film directly to a gas phase without passing through a liquid phase precludes the surface tension of liquid from acting upon the pattern to prevent the collapse of the pattern.

PRIOR ART DOCUMENTS

Patent Documents

Patent Document 1: Japanese Patent Application Laid-Open No. 2010-199261

SUMMARY

Problem to be Solved by the Invention

Unfortunately, it has turned out that the phenomenon of the collapse of the pattern still occurs even when a drying gas such as nitrogen gas is blown onto a frozen film of liquid to sublimate the frozen film.

In view of the foregoing, it is therefore an object of the present invention to provide a substrate drying method and a substrate drying apparatus which are capable of drying a surface of a substrate while preventing the collapse of a pattern formed on the surface of the substrate.

Means to Solve the Problem

To solve the aforementioned problem, a first aspect of the present invention is intended for a substrate drying method for removing a liquid adhering to a front surface of a substrate. The substrate drying method comprises: a supplying step for supplying a processing liquid containing a sublimable material to the front surface of the substrate to form a liquid film of the processing liquid; a solidifying step for solidifying the liquid film of the processing liquid formed on the front surface of the substrate into a solid; and a sublimating step for supplying a drying gas to the solid formed on the front surface of the substrate to sublimate the solid, wherein the drying gas is supplied in the sublimating step so that the flow rate thereof per unit area is constant over the entire surface of the substrate.

A second aspect of the present invention is intended for the substrate drying method of the first aspect, wherein a fluid at a temperature lower than the solidifying point of the sublimable material is supplied to a back surface of the substrate to solidify the liquid film in the solidifying step.

A third aspect of the present invention is intended for the substrate drying method of the first aspect, which further comprises a temperature controlling step for increasing the temperature of the substrate to an ambient temperature or above after the solid is sublimated.

A fourth aspect of the present invention is intended for the substrate drying method of the first aspect, wherein the sublimable material is 1,1,2,2,3,3,4-heptafluorocyclopentane.

A fifth aspect of the present invention is intended for the substrate drying method of the first aspect, wherein the drying gas is supplied in the sublimating step so that $2\pi r{:}N$ is constant over the entire surface of the substrate where N is the total flow rate of the drying gas blown onto the circumference of a circle having a distance r from the center of the substrate.

A sixth aspect of the present invention is intended for a substrate drying apparatus for removing a liquid adhering to a front surface of a substrate. The substrate drying apparatus comprises: a liquid supply part for supplying a processing liquid containing a sublimable material to the front surface of the substrate to form a liquid film of the processing liquid; a solidified body forming part for solidifying the liquid film of the processing liquid formed on the front surface of the substrate into a solid; and a gas supply part for supplying a drying gas to the solid formed on the front surface of the substrate to sublimate the solid, wherein the gas supply part supplies the drying gas so that the flow rate thereof per unit area is constant over the entire surface of the substrate.

A seventh aspect of the present invention is intended for the substrate drying apparatus of the sixth aspect, wherein the gas supply part includes an annular orifice of a ring-shaped configuration for ejecting the drying gas toward a peripheral portion of the substrate in a spreading manner, and a central orifice provided at the center of the annular orifice and for ejecting the drying gas toward a central portion of the substrate in a spreading manner.

An eighth aspect of the present invention is intended for the substrate drying apparatus of the sixth aspect, wherein the gas supply part includes a punched plate provided in opposed relation to the entire surface of the substrate and including a plurality of openings for ejecting the drying gas so as to have an even aperture ratio.

A ninth aspect of the present invention is intended for the substrate drying apparatus of the sixth aspect, wherein the solidified body forming part supplies a fluid at a temperature lower than the solidifying point of the sublimable material to a back surface of the substrate to solidify the liquid film.

A tenth aspect of the present invention is intended for the substrate drying apparatus of the sixth aspect, which further comprises a temperature controlling part for increasing the temperature of the substrate to an ambient temperature or above after the solid is sublimated.

An eleventh aspect of the present invention is intended for the substrate drying apparatus of the sixth aspect, wherein the sublimable material is 1,1,2,2,3,3,4-heptafluorocyclopentane.

A twelfth aspect of the present invention is intended for the substrate drying apparatus of the sixth aspect, wherein the gas supply part supplies the drying gas so that $2\pi r:N$ is constant over the entire surface of the substrate where N is the total flow rate of the drying gas blown onto the circumference of a circle having a distance r from the center of the substrate.

Effects of the Invention

In the substrate drying method according to the first to fifth aspects, the drying gas is supplied so that the flow rate thereof per unit area is constant over the entire surface of the substrate in the sublimating step for supplying the drying gas to the solid formed on the front surface of the substrate to sublimate the solid. Thus, the solid is sublimated uniformly over the entire surface of the substrate, whereby the front surface of the substrate is dried while the collapse of a pattern formed on the front surface of the substrate is prevented.

In particular, in the substrate drying method according to the third aspect, the temperature of the substrate is increased to the ambient temperature or above after the solid is sublimated. This prevents dew condensation from occurring on the substrate.

In the substrate drying apparatus according to the sixth to twelfth aspects, the gas supply part for supplying the drying gas to the solid formed on the front surface of the substrate to sublimate the solid supplies the drying gas so that the flow rate thereof per unit area is constant over the entire surface of the substrate. Thus, the solid is sublimated uniformly over the entire surface of the substrate, whereby the front surface of the substrate is dried while the collapse of a pattern formed on the front surface of the substrate is prevented.

In particular, in the substrate drying apparatus according to the tenth aspect, the temperature of the substrate is increased to the ambient temperature or above after the solid is sublimated. This prevents dew condensation from occurring on the substrate.

DESCRIPTION OF EMBODIMENT(S)

An embodiment according to the present invention will now be described in detail with reference to the drawings.

Figure 1:
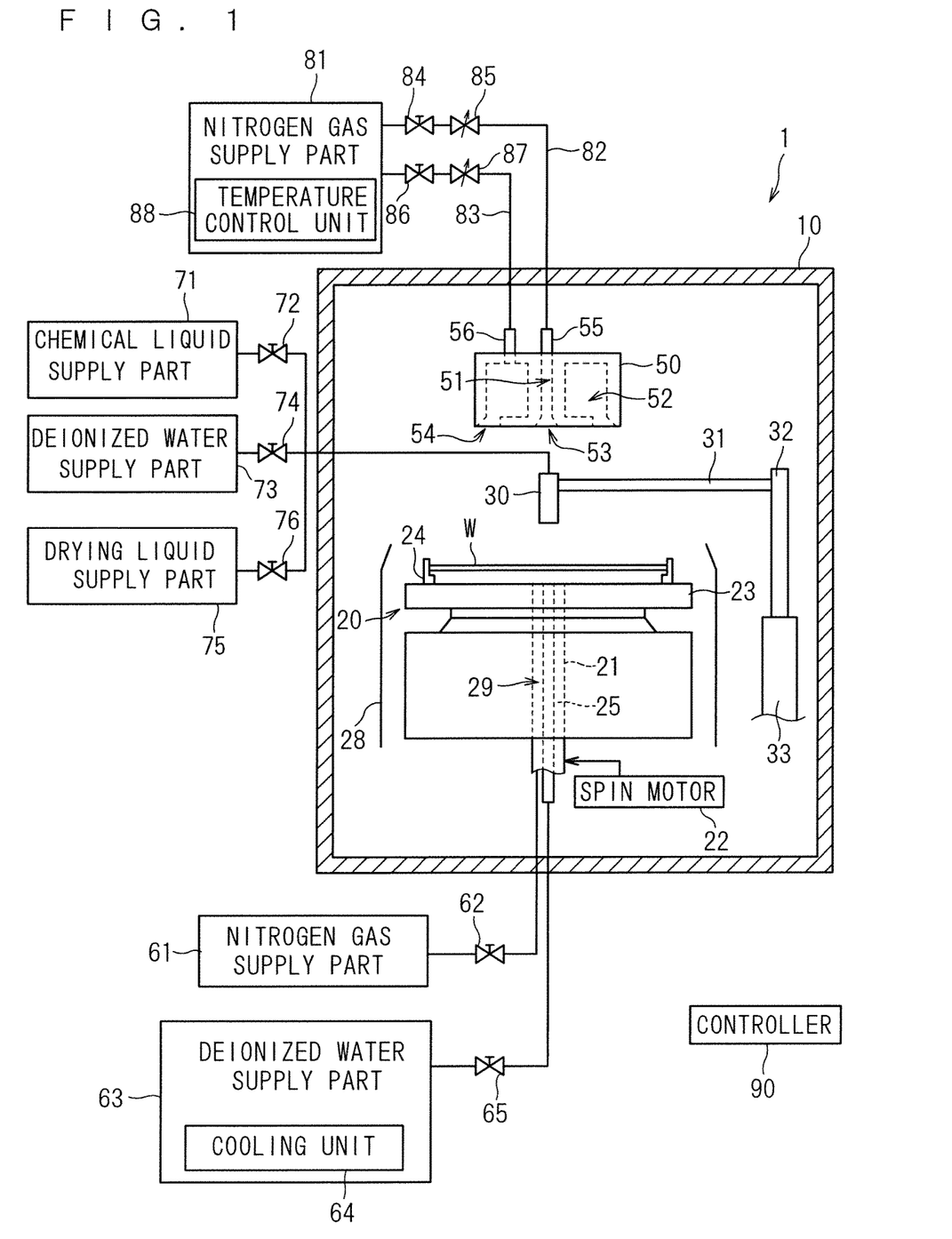
FIG. 1 is a view showing an overall configuration of principal parts of a substrate drying apparatus according to the present invention.

FIG. 1 is a view showing an overall configuration of principal parts of a substrate drying apparatus according to the present invention. This substrate drying apparatus 1 is an apparatus which performs various liquid processes on a front surface of a disk-shaped substrate W such as a semiconductor wafer and performs a drying process by removing a liquid adhering to the front surface of the substrate W subjected to the liquid processes. The size of the substrate W becoming subject to the processes is not particularly limited. For example, the substrate W becoming subject to the processes has a diameter of 300 mm and 450 mm (in the present embodiment, 300 mm). It should be noted that the dimensions of components and the number of components are shown in exaggeration or in simplified form, as appropriate, in FIG. 1 and the subsequent figures for the sake of easier understanding.

The substrate drying apparatus 1 includes a chamber 10 having an inside processing space for receiving the substrate W therein to perform the liquid processes and the drying process therein. The substrate drying apparatus 1 includes a spin chuck 20 for rotating the substrate W while holding the substrate W in a substantially horizontal attitude, a processing liquid nozzle 30 for ejecting various processing liquids toward an upper surface of the substrate W, and a gas nozzle 50 disposed in opposed relation to the upper surface of the substrate W held by the spin chuck 20, all of which serve as principal elements within the chamber 10. The substrate drying apparatus 1 further includes a controller 90 for controlling operating mechanisms provided in the apparatus to cause the operating mechanisms to perform processes on the substrate W.

The spin chuck 20 includes a spin base 23, a rotation support shaft 21, a spin motor 22, and a plurality of chuck pins 24. The disk-shaped spin base 23 is coupled to an upper end portion of the rotation support shaft 21 with a fastening part such as a screw. The rotation support shaft 21 is coupled to a rotary shaft of the spin motor 22. The driving of the spin motor 22 is transmitted through the rotation support shaft 21 to the spin base 23. Thus, the spin motor 22 is driven in response to an operating instruction from the controller 90, whereby the spin base 23 holding the substrate W rotates in a horizontal plane at a predetermined rpm.

The chuck pins 24 for gripping an edge portion of the substrate W are provided upright on a peripheral portion of an upper surface of the spin base 23. It is only necessary that three or more chuck pins 24 are provided to grip the disk-shaped substrate W with reliability. The chuck pins 24 are spaced at equal angles along the peripheral portion of the spin base 23. Each of the chuck pins 24 includes a substrate support portion for supporting the edge portion of the substrate W from below, and a substrate holding portion for pressing an outer peripheral edge surface of the substrate W held by the substrate support portion to grip the substrate W (both not shown). Each of the chuck pins 24 is allowed to switch between a pressing state in which the substrate holding portion presses the outer peripheral edge surface of the substrate W and a releasing state in which the substrate holding portion is separated from the outer peripheral edge surface of the substrate W.

For transfer of the substrate W to and from the spin base 23, all of the chuck pins 24 are in the releasing state. For processes of the substrate W, all of the chuck pins 24 are in the pressing state. By placing the chuck pins 24 in the pressing state, the chuck pins 24 grip the edge portion of the substrate W to hold the substrate W in a substantially horizontal attitude at a predetermined distance from the upper surface of the spin base 23.

The rotation support shaft 21 of the spin chuck 20 is a hollow shaft. A lower processing liquid supply pipe 25 for supplying a processing liquid to a lower surface of the substrate W is inserted through the inside of the rotation support shaft 21. The rotation support shaft 21 and the lower processing liquid supply pipe 25 achieve a double-pipe structure. A gap between an inner wall surface of the rotation support shaft 21 and an outer wall surface of the lower processing liquid supply pipe 25 serves as a cylindrical lower gas supply passage 29. The lower processing liquid supply pipe 25 and the lower gas supply passage 29 extend to a position close to the lower surface of the substrate W held by the spin chuck 20, and have distal ends which form orifices for ejecting DIW (deionized water) and nitrogen gas ($N_2$), respectively, toward the center of the lower surface of the substrate W.

The lower gas supply passage 29 is connected in communication with a nitrogen gas supply part 61 through a valve 62. When the valve 62 is open, the nitrogen gas supply part 61 feeds nitrogen gas to the lower gas supply passage 29. The nitrogen gas fed to the lower gas supply passage 29 is jetted out from the orifice at the distal end of the lower gas supply passage 29 toward the vicinity of a central portion of the lower surface of the substrate W held by the spin chuck 20. It should be noted that the nitrogen gas supply part 61 may include a gas cooling mechanism to supply cooled nitrogen gas to the substrate W.

The lower processing liquid supply pipe 25 is connected in communication with a deionized water supply part 63 through a valve 65. When the valve 65 is open, the deionized water supply part 63 feeds deionized water to the lower processing liquid supply pipe 25. The deionized water supply part 63 includes a cooling unit 64. The cooling unit 64 is formed, for example, by a heat exchanger, and cools the deionized water to a temperature lower than room temperature. The deionized water supply part 63 feeds the deionized water (cold water) cooled by the cooling unit 64 to the lower processing liquid supply pipe 25. The deionized water fed to the lower processing liquid supply pipe 25 is ejected from the orifice at the distal end of the lower processing liquid supply pipe 25 toward the vicinity of the central portion of the lower surface of the substrate W held by the spin chuck 20.

A splash guard 28 is provided so as to surround the spin chuck 20. The splash guard 28 receives and collects a processing liquid splashed from the spin base 23 and the substrate W which are rotating. The splash guard 28 may be of a multi-stage configuration for receiving processing liquids (e.g., a chemical liquid and deionized water) in different opening portions depending on the type of the processing liquids to collect the respective processing liquids through separate paths.

The processing liquid nozzle 30 is provided within the chamber 10. The processing liquid nozzle 30 is attached to a distal end of a nozzle arm 31 provided so as to extend in a horizontal direction. The nozzle arm 31 has a proximal end coupled to a rotary shaft 32. The rotary shaft 32 is connected to a pivot motor 33. Thus, the pivot motor 33 is driven in response to an operating instruction from the controller 90 to thereby enable the processing liquid nozzle 30 to pivot between an ejecting position lying over the center of the substrate W and a retracted position lying outside the splash guard 28.

The processing liquid nozzle 30 is connected in communication with a chemical liquid supply part 71, a deionized water supply part 73, and a drying liquid supply part 75 through a valve 72, a valve 74, and a valve 76, respectively. When the valve 72 is open, a chemical liquid such as SC1 (a mixed solution of aqueous ammonia, a hydrogen peroxide solution, and deionized water) and SC2 (a mixed solution of hydrochloric acid, a hydrogen peroxide solution, and deionized water), for example, is fed from the chemical liquid supply part 71 to the processing liquid nozzle 30. Also, the chemical liquid supply part 71 is able to feed IPA (isopropyl alcohol) as a chemical liquid to the processing liquid nozzle 30. When the valve 74 is open, deionized water is fed from the deionized water supply part 73 to the processing liquid nozzle 30.

When the valve 76 is open, a drying liquid is fed from the drying liquid supply part 75 to the processing liquid nozzle 30. The term "drying liquid" refers to a processing liquid containing a sublimable material. The term "sublimable material" refers to a material having the property of making a phase transition (sublimating) from a solid phase to a gas phase or vice versa without passing through a liquid phase. Examples of the sublimable material having such a property include 1,1,2,2,3,3,4-heptafluorocyclopentane (a vapor pressure of 8.2 kPa at 20° C., a surface tension of 19.6 mN/m at 25° C., and a melting point of 20.5° C.) and dodecafluorocyclohexane (a vapor pressure of 33.1 kPa at 20° C., a surface tension of 12.6 mN/m at 25° C., and a melting point of 51° C.). In the present embodiment, 1,1,2,2,3,3,4-heptafluorocyclopentane is used as the sublimable material. The drying liquid may be made of only a sublimable material in a liquid phase or be a mixture of a sublimable material and an organic solvent such as alcohols.

The term "processing liquid" used in the present description means a concept including all of the chemical liquid, the deionized water, and the drying liquid. When fed to the processing liquid nozzle 30 placed in the ejecting position lying over the center of the substrate W held by the spin chuck 20, the processing liquid is ejected from the processing liquid nozzle 30 toward the vicinity of the center of the upper surface of the substrate W.

The gas nozzle 50 is provided over the spin chuck 20 within the chamber 10. The gas nozzle 50 has a cylindrical shape. The gas nozzle 50 of a cylindrical shape has a diameter smaller than that of the substrate W. The gas nozzle 50 is held movably in upward and downward directions over the spin chuck 20 by an elevating mechanism not shown. The elevating mechanism moves the gas nozzle 50 upwardly and downwardly to thereby adjust the distance between the substrate W held by the spin chuck 20 and the gas nozzle 50.

Figure 2:
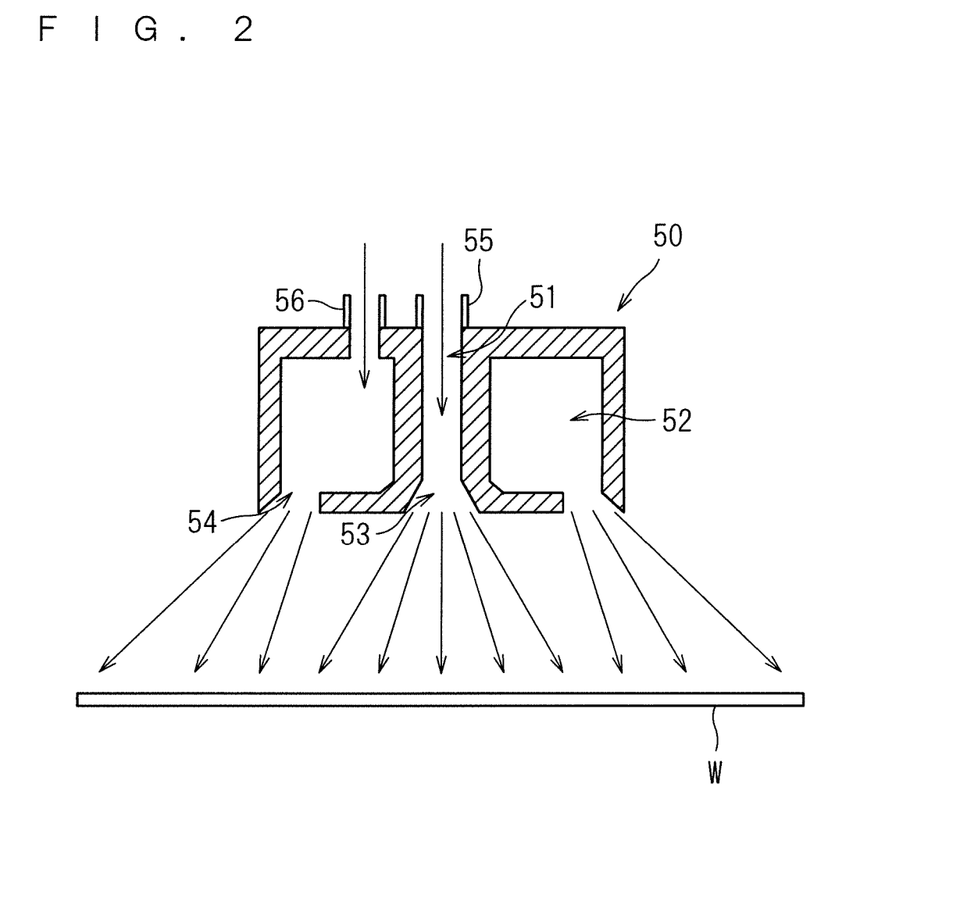
FIG. 2 is a sectional view showing a configuration of a gas nozzle.

FIG. 2 is a sectional view showing a configuration of the gas nozzle 50. A central supply passage 51 is provided so as to pass through the central axis of the gas nozzle 50 having the cylindrical shape. The central axis of the gas nozzle 50 coincides with the central axis of the substrate W held by the spin chuck 20. A central orifice 53 which is open toward the central portion of the substrate W held by the spin chuck 20 is formed at a lower end of the central supply passage 51. The central orifice 53 is in a tapered form such as to flare out downwardly (i.e., toward the substrate W).

A buffer space 52 of a ring-shaped configuration is formed inside the gas nozzle 50 so as to surround the central supply passage 51. An annular orifice 54 of a ring-shaped configuration is formed in a peripheral portion of a lower end of the gas nozzle 50. The annular orifice 54 is in communication with the buffer space 52, and serves also as an opening for the buffer space 52. The annular orifice 54 is also in a tapered form such as to flare out downwardly. The central orifice 53 is positioned in the center of the annular orifice 54 of a ring-shaped configuration when the gas nozzle 50 is viewed from below.

A gas inlet 55 is formed in an upper end of the central supply passage 51. A gas inlet 56 is formed on the upper side of the buffer space 52. As shown in FIG. 1, the gas inlet 55 is connected in communication with a nitrogen gas supply part 81 through a gas pipe 82, and the gas inlet 56 is connected in communication with the nitrogen gas supply part 81 through a gas pipe 83. A valve 84 and a flow regulating valve 85 are interposed in the path of the gas pipe 82. A valve 86 and a flow regulating valve 87 are interposed in the path of the gas pipe 83.

When the valve 84 is opened, nitrogen gas is fed from the nitrogen gas supply part 81 through the gas pipe 82 and the gas inlet 55 to the central supply passage 51. The flow rate of the nitrogen gas flowing in the gas pipe 82 is controlled by the flow regulating valve 85, based on an instruction from the controller 90. The nitrogen gas fed to the central supply passage 51 is ejected from the central orifice 53 toward the substrate W held by the spin chuck 20.

When the valve 86 is opened, on the other hand, nitrogen gas is fed from the nitrogen gas supply part 81 through the gas pipe 83 and the gas inlet 56 to the buffer space 52. The flow rate of the nitrogen gas flowing in the gas pipe 83 is controlled by the flow regulating valve 87, based on an instruction from the controller 90. The nitrogen gas fed to the buffer space 52 is ejected from the annular orifice 54 toward the substrate W held by the spin chuck 20. The nitrogen gas fed through the gas pipe 83 is supplied temporarily to the buffer space 52, in which the flow velocity of the nitrogen gas is suppressed. Thus, the nitrogen gas is ejected at a uniform flow rate over the entire circumference of the annular orifice 54.

As shown in FIG. 2, the nitrogen gas fed to the central supply passage 51 is ejected from the tapered central orifice 53 toward the vicinity of the central portion of the substrate W in a spreading manner. Similarly, the nitrogen gas fed to the buffer space 52 is ejected from the tapered annular orifice 54 toward a peripheral portion of the substrate W in a spreading manner. As a result, the nitrogen gas is jetted out from the gas nozzle 50 toward the entire upper surface of the substrate W held by the spin chuck 20.

The positioning of the gas nozzle 50 is effected so that the distance between the substrate W held by the spin chuck 20 and the gas nozzle 50 has a predetermined value, and the respective flow rates of the nitrogen gas ejected from the central orifice 53 and the annular orifice 54 are adjusted by the flow regulating valves 85 and 87, whereby the nitrogen gas is blown onto the entire surface of the substrate W at a uniform flow rate. More precisely, the nitrogen gas is ejected from the gas nozzle 50 so that $2\pi r:N$ is constant over the entire upper surface of the substrate W where N is the total flow rate of the nitrogen gas blown onto the circumference of a circle having a distance (radius) r from the center of the substrate W. This means that the nitrogen gas is supplied from the gas nozzle 50 so that the flow rate thereof per unit area is constant over the entire surface of the substrate W. It should be noted that the total flow rate of the nitrogen gas ejected from both the central orifice 53 and the annular orifice 54 is on the order of 50 to 200 liters per minute when the substrate W is a semiconductor wafer having a diameter of 300 mm.

The nitrogen gas supply part 81 includes a temperature control unit 88. The temperature control unit 88 is formed, for example, by a heat exchanger, and controls the temperature of the nitrogen gas fed from the nitrogen gas supply part 81 at a predetermined temperature. The gas nozzle 50 ejects the nitrogen gas temperature-controlled by the temperature control unit 88 onto the entire upper surface of the substrate W so that the flow rate thereof per unit area is constant.

The controller 90 controls the aforementioned various operating mechanisms (motors, valves, and the like) provided in the substrate drying apparatus 1. The controller 90 is similar in hardware configuration to a typical computer. Specifically, the controller 90 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 90 executes a predetermined processing program, whereby the processes in the substrate drying apparatus 1 proceed.

Figure 3:
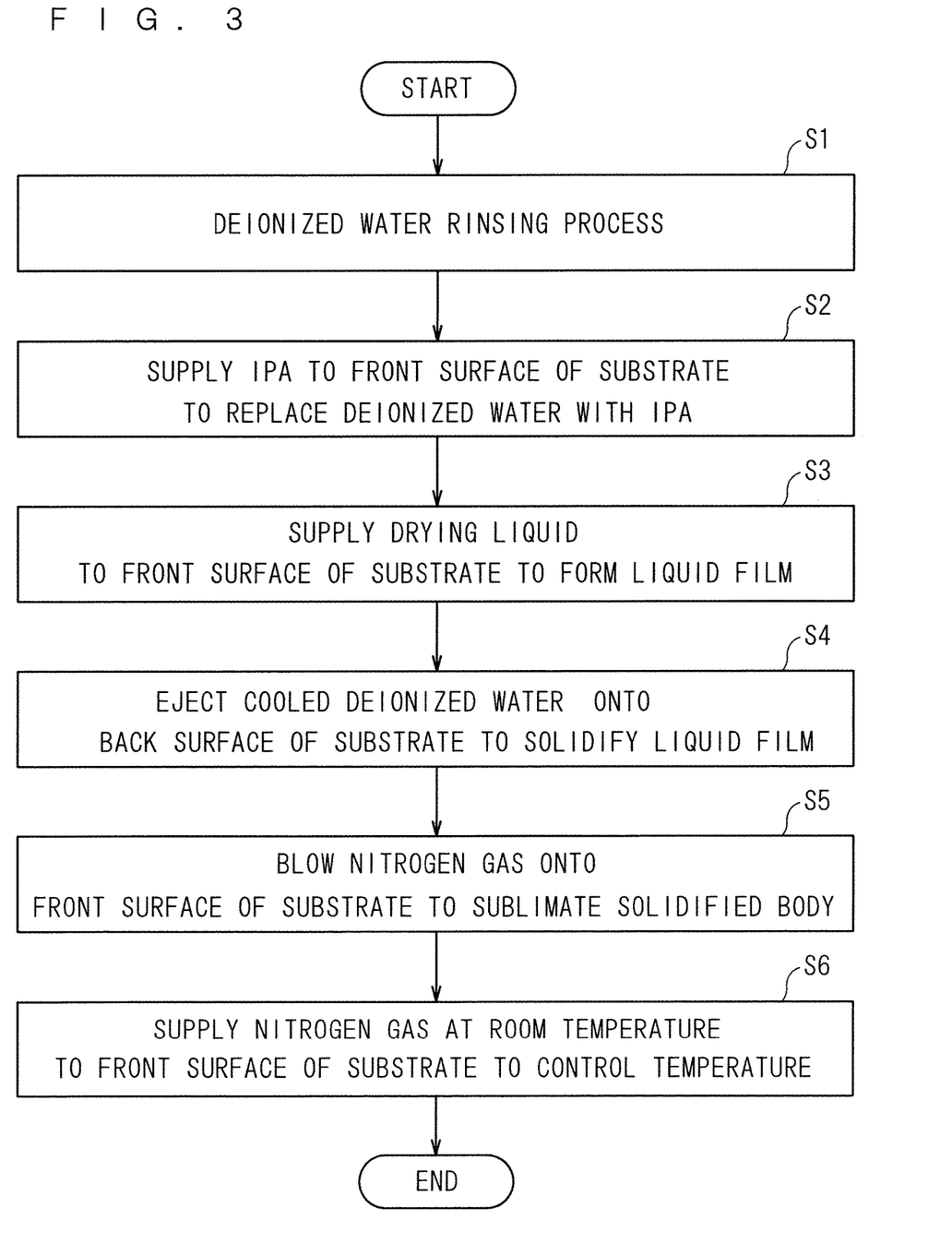
FIG. 3 is a flow diagram showing a procedure in the substrate drying apparatus.
Figure 4:
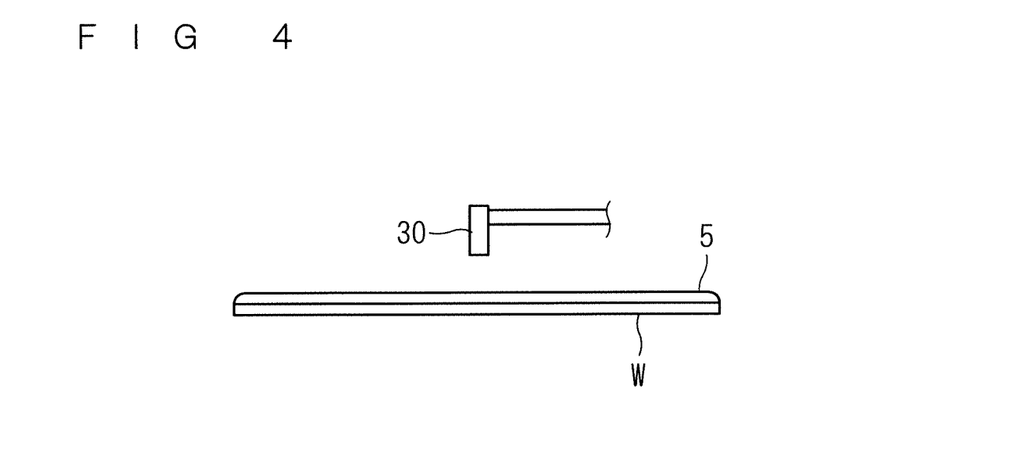
FIG. 4 is a view showing that a liquid film of a drying liquid is formed on a front surface of a substrate.
Figure 5:
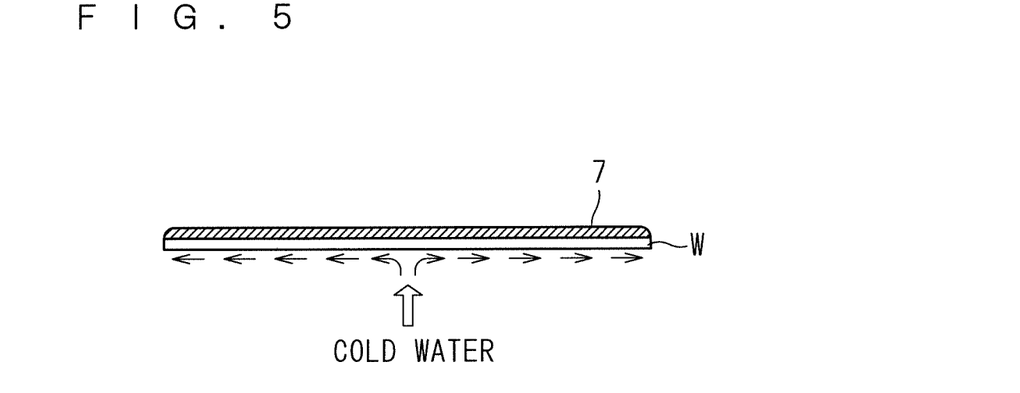
FIG. 5 is a view showing that cold water is ejected onto a back surface of the substrate on which the liquid film of the drying liquid is formed.
Figure 6:
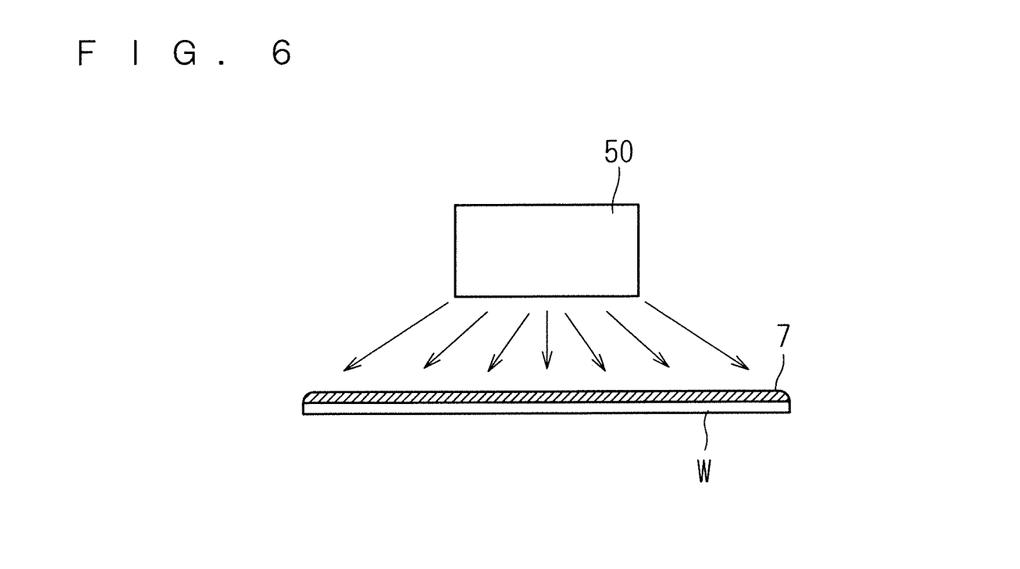
FIG. 6 is a view showing that nitrogen gas is blown from the gas nozzle onto a solidified body on the front surface of the substrate.

Next, a processing operation in the substrate drying apparatus 1 having the aforementioned configuration will be described. FIG. 3 is a flow diagram showing a procedure in the substrate drying apparatus 1. FIGS. 4 to 6 are views schematically showing operations in the processes of FIG. 3. The procedure in the substrate drying apparatus 1 to be described below proceeds under the control of the controller 90 over the operating mechanisms of the substrate drying apparatus 1.

The front surface of the substrate W becoming subject to the processes by the aforementioned substrate drying apparatus 1 is previously patterned by a technique including photolithography and the like. In the present description, the "front surface" of the substrate W refers to a main surface of the substrate W which is patterned, and the "back surface" of the substrate W refers to a main surface of the substrate W which is not patterned on the side opposite from the front surface. The "upper surface" of the substrate W refers to a main surface of the substrate W which faces upward, and the "lower surface" of the substrate W refers to a main surface of the substrate W which faces downward. The front surface of the substrate W sometimes becomes the upper surface, and sometimes becomes the lower surface.

In the substrate drying apparatus 1, the patterned substrate W is transported into the chamber 10 and held in a substantially horizontal attitude by the spin chuck 20, and various cleaning processes are performed on the substrate W. For example, the processing liquid nozzle 30 moves to the ejecting position lying over the center of the substrate W, and a chemical liquid such as SC1 is supplied from the processing liquid nozzle 30 to the center of the front surface of the substrate W rotated by the spin chuck 20, whereby a front surface cleaning process is performed. It should be noted that the substrate W transported into the chamber 10 is held by the spin chuck 20 in such an attitude that the patterned front surface of the substrate W is the upper surface.

Typically, after the completion of the cleaning process using the chemical liquid, deionized water is supplied from the processing liquid nozzle 30 to the center of the front surface of the rotating substrate W, whereby a deionized water rinsing process is performed (Step S1). In the deionized water rinsing process, deionized water may be supplied from the lower processing liquid supply pipe 25 toward the back surface of the substrate W in addition to the deionized water supplied to the front surface. The deionized water supplied to the front surface (and the back surface) of the rotating substrate W flows over the front surface of the substrate W by centrifugal force, is splashed from the edge portion of the substrate W, and is collected by the splash guard 28. At the point in time when the deionized water rinsing process is completed, deionized water adheres to the front surface of the substrate W. The deionized water is removed by a substrate drying technique according to the present invention in a manner to be described below.

First, IPA is supplied from the processing liquid nozzle 30 to the front surface of the substrate W, so that the deionized water adhering to the front surface is replaced with the IPA (Step S2). Specifically, the valve 72 is opened to feed the IPA from the chemical liquid supply part 71 to the processing liquid nozzle 30, thereby supplying the IPA from the processing liquid nozzle 30 to the center of the front surface of the substrate W rotated by the spin chuck 20. The IPA supplied to the front surface of the substrate W flows over the front surface of the substrate W from the center to the peripheral portion thereof by centrifugal force, and spreads over the entire front surface of the substrate W. This causes the replacement of the deionized water adhering to the front surface of the substrate W after the deionized water rinsing process with the IPA. Such a replacement process with the IPA is performed for the reason that the sublimable material (in the present embodiment, 1,1,2,2,3,3,4-heptafluorocyclopentane) contained in the drying liquid to be supplied in the next step is poor in solubility in water, so that the drying liquid is immiscible with the deionized water remaining on the front surface of the substrate.

Next, the drying liquid is supplied from the processing liquid nozzle 30 to the front surface of the substrate W to form a liquid film of the drying liquid on the front surface (Step S3). During the execution of this liquid film forming step, the spin chuck 20 rotates the substrate W at a constant speed, based on an operating instruction from the controller 90. Then, the valve 72 is closed and the valve 76 is opened to feed the drying liquid from the drying liquid supply part 75 to the processing liquid nozzle 30, thereby supplying the drying liquid from the processing liquid nozzle 30 to the center of the front surface of the rotating substrate W. The temperature of the drying liquid supplied from the processing liquid nozzle 30 to the substrate W is equal to or higher than the melting point (20.5° C.) of the sublimable material contained in the drying liquid and lower than the boiling point thereof. Setting the temperature of the drying liquid within such a temperature range allows the processing liquid nozzle 30 to supply the drying liquid in a liquid phase to the substrate W.

The drying liquid supplied to the center of the front surface of the substrate W spreads uniformly radially outwardly over the front surface of the substrate W by centrifugal force resulting from the rotation of the substrate W. Part of the supplied drying liquid is spun off outwardly from the substrate W by centrifugal force. This causes the replacement of the IPA adhering to the front surface of the substrate W with the drying liquid, and forms a liquid film of the drying liquid having a uniform thickness over the entire front surface of the substrate W. The thickness of the liquid film of the drying liquid is preferably at least greater than the height of protrusions of the pattern formed on the front surface of the substrate W. FIG. 4 is a view showing that the drying liquid is supplied from the processing liquid nozzle 30 to form a liquid film 5 of the drying liquid on the front surface of the substrate W. The drying liquid may be supplied to the front surface of the substrate W to form the liquid film 5, with the rotation of the substrate W stopped. After the liquid film 5 of the drying liquid is formed on the front surface of the substrate W, the valve 76 is closed, and the processing liquid nozzle 30 is moved to the retracted position lying outside the splash guard 28.

Subsequently, cooled deionized water is ejected onto the back surface of the substrate W to solidify the liquid film 5 of the drying liquid (Step S4). During the execution of this solidifying step, the spin chuck 20 rotates the substrate W at a constant speed, based on an operating instruction from the controller 90. Then, the valve 65 is opened to supply the deionized water from the deionized water supply part 63 to the lower processing liquid supply pipe 25, thereby ejecting the deionized water toward the vicinity of the center of the back surface of the rotating substrate W. The deionized water supplied from the deionized water supply part 63 is cooled by the cooling unit 64 to a temperature lower than the solidifying point (=melting point) of the sublimable material contained in the drying liquid. That is, cold water is ejected onto the back surface of the substrate W. In the present embodiment, the deionized water supplied from the deionized water supply part 63 is cooled to approximately 2° C.

FIG. 5 is a view showing that cold water is ejected onto the back surface of the substrate W on which the liquid film 5 of the drying liquid is formed. The cold water ejected toward the vicinity of the center of the back surface of the substrate W runs from the vicinity of the center of the back surface of the substrate W toward the peripheral portion thereof by centrifugal force resulting from the rotation of the substrate W, and spreads over the entire back surface of the substrate W. This cools the liquid film 5 of the drying liquid formed on the front surface of the substrate W to a temperature lower than the solidifying point of the sublimable material to solidify the liquid film 5 of the drying liquid, thereby forming a solidified body (frozen body) 7 of the drying liquid on the front surface of the substrate W. That is, the drying liquid on the front surface of the substrate W makes a phase transition from a liquid phase to a solid phase. There is a possibility that a volume change occurs when the drying liquid is solidified. However, the pressure applied to the pattern of the substrate W due to the volume change is equal in every direction to cancel out the force applied to the pattern. As a result, the collapse of the pattern resulting from the solidification of the drying liquid is prevented.

After the entire liquid film 5 of the drying liquid is solidified to form the solidified body 7, nitrogen gas is blown as a drying gas from the gas nozzle 50 onto the front surface of the substrate W to sublimate the solidified body 7 (Step S5). During the execution of this sublimating step, the spin chuck 20 rotates the substrate W at a constant speed, based on an operating instruction from the controller 90. The cooled deionized water continues to be ejected onto the back surface of the substrate W. This allows the solidified body 7 on the front surface of the substrate W to be maintained at a low temperature lower than the solidifying point of the sublimable material, thereby preventing the solidified body 7 from melting into a liquid again with reliability.

For the sublimating step, the vertical positioning of the gas nozzle 50 is effected so that the distance between the substrate W held by the spin chuck 20 and the gas nozzle 50 has a previously set predetermined value. Then, the valve 84 and the valve 86 are opened to feed nitrogen gas from the nitrogen gas supply part 81 to the gas nozzle 50, thereby blowing the nitrogen gas from the gas nozzle 50 onto the solidified body 7 on the front surface of the substrate W. The temperature of the nitrogen gas fed from the nitrogen gas supply part 81 is controlled at a predetermined temperature (in the present embodiment, approximately 7° C.) by the temperature control unit 88.

FIG. 6 is a view showing that nitrogen gas is blown from the gas nozzle 50 onto the solidified body 7 on the front surface of the substrate W. The partial pressure of a vapor of the sublimable material in the nitrogen gas blown from the gas nozzle 50 onto the solidified body 7 is significantly lower than the vapor pressure of the sublimable material of the solidified body 7 at the temperature for maintaining the solidified body 7. As a result, the sublimation of the solidified body 7 occurs. The phase transition (sublimation) of the solidified body 7 from a solid phase to a gas phase without passing through a liquid phase precludes the surface tension of a liquid from acting upon the pattern formed on the front surface of the substrate W. This achieves the removal of the solidified body 7 of the drying liquid to dry the substrate W while preventing the collapse of the pattern.

As a result of diligent investigations, the present inventors and others have found out that merely blowing nitrogen gas onto the solidified body 7 causes a problem to be described below. For example, when nitrogen gas for drying is blown to the vicinity of the center of the solidified body 7 on the substrate W so as to flow along the front surface of the substrate as disclosed in Patent Document 1, the solidified body 7 on the central portion of the substrate is sublimated first, and the sublimation proceeds gradually toward the peripheral portion of the substrate. That is, a gas-solid interface of the solidified body 7 moves from the center of the substrate W toward the peripheral portion thereof.

Figure 7:
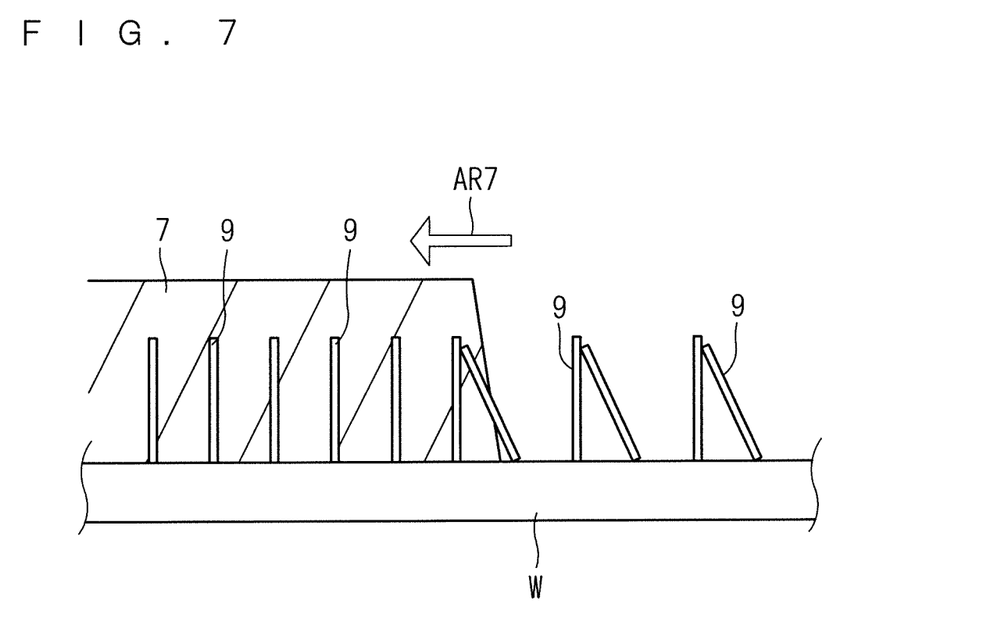
FIG. 7 is a view schematically showing a phenomenon occurring when a gas-solid interface of the solidified body moves along a main surface of the substrate.

FIG. 7 is a view schematically showing a phenomenon occurring when the gas-solid interface of the solidified body 7 moves along a main surface of the substrate. As mentioned above, the front surface of the substrate W is patterned in such a manner that a plurality of protrusions 9 of the pattern are provided upright on the front surface. It has turned out that when the sublimation of the solidified body 7 proceeds by blowing the nitrogen gas for drying to cause the gas-solid interface of the solidified body 7 to move along the front surface of the substrate W from the center toward the peripheral portion thereof (i.e., parallel to the front surface of the substrate W) as indicated by an arrow AR7, some of the protrusions 9 of the pattern are pulled by the movement of the gas-solid interface to collapse.

Figure 8:
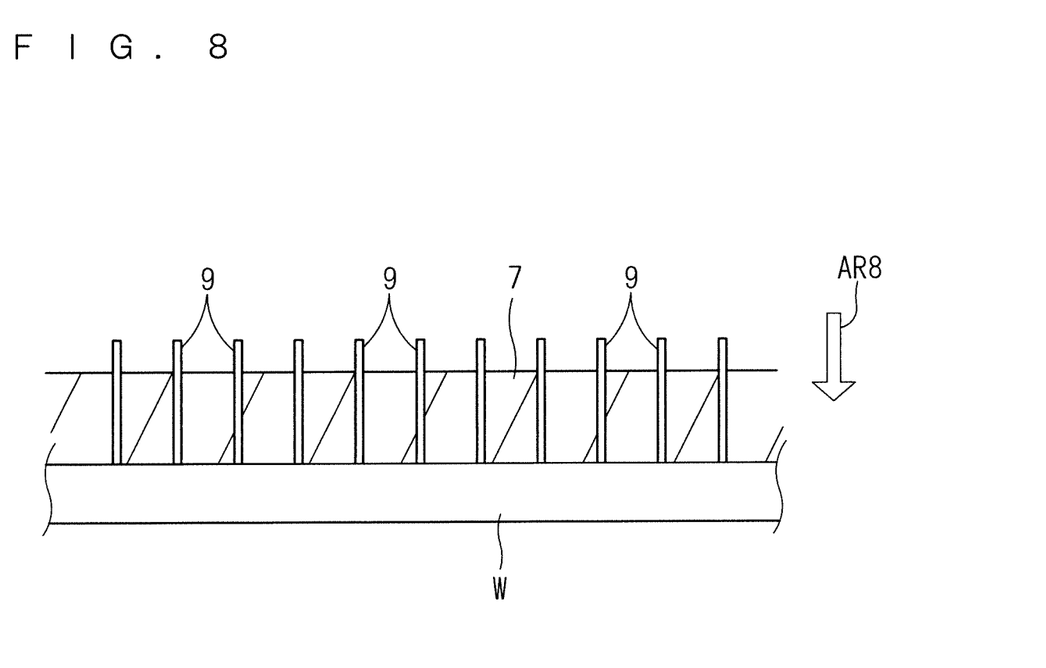
FIG. 8 is a view schematically showing a phenomenon occurring when nitrogen gas is supplied so that the flow rate thereof per unit area is constant over the entire surface of the substrate.

The present invention has been completed based on the aforementioned findings. According to the present invention, nitrogen gas serving as a drying gas is supplied from the gas nozzle 50 toward the solidified body 7 on the substrate W so that the flow rate thereof per unit area is constant over the entire surface of the substrate W. FIG. 8 is a view schematically showing a phenomenon occurring when nitrogen gas is supplied so that the flow rate thereof per unit area is constant over the entire surface of the substrate W.

When nitrogen gas is supplied toward the solidified body 7 so that the flow rate thereof per unit area is constant over the entire surface of the substrate W, the solidified body 7 is sublimated at a uniform sublimation rate over the entire front surface of the substrate W. As a result, the sublimation proceeds so that the thickness of the entire solidified body 7 decreases gradually, and the gas-solid interface of the solidified body 7 moves in a direction perpendicular to the front surface of the substrate W as indicated by an arrow AR8 in FIG. 8. This precludes the protrusions 9 of the pattern from being pulled by the movement of the gas-solid interface of the solidified body 7, whereby the substrate W is dried well by sublimating the solidified body 7 while the collapse of the pattern formed on the front surface of the substrate W is prevented with reliability.

After the solidified body 7 on the substrate W is completely sublimated, nitrogen gas at room temperature is supplied from the gas nozzle 50 to the front surface of the substrate W to control the temperature of the substrate W (Step S6). Immediately after the solidified body 7 is removed from the front surface of the substrate W, the temperature of the substrate W is lower than the solidifying point of the sublimable material. If the substrate W at such a low temperature is transported out of the chamber 10, there is a danger that dew condensation occurs on the substrate W. To prevent this, the present embodiment performs the temperature controlling step for controlling the temperature of the substrate W at ambient temperature or above to prevent the dew condensation after the solidified body 7 is sublimated. During the execution of this temperature controlling step, the spin chuck 20 rotates the substrate W at a constant speed, based on an operating instruction from the controller 90. Also, the valve 65 is closed to stop the supply of the cold water to the back surface of the substrate W. Then, nitrogen gas is fed from the nitrogen gas supply part 81 to the gas nozzle 50, whereby the nitrogen gas is blown from the gas nozzle 50 onto the front surface of the substrate W. In the present embodiment, the temperature of the nitrogen gas fed from the nitrogen gas supply part 81 in the temperature controlling step is controlled at room temperature (approximately 23° C.) in the field of semiconductor manufacture by the temperature control unit 88. It should be noted that the controlled temperature of the nitrogen gas may be equal to or higher than the ambient temperature of the substrate W.

The supply of the nitrogen gas at room temperature to the front surface of the substrate W returns the temperature of the substrate W to near room temperature. The temperature control of the substrate W at near room temperature prevents the occurrence of dew condensation on the substrate W with reliability. Thereafter, the processed substrate W is transported out of the chamber 10. This completes the processes in the substrate drying apparatus 1.

In the present embodiment, nitrogen gas is supplied to the solidified body 7 formed on the front surface of the substrate W so that the flow rate thereof per unit area is constant over the entire surface of the substrate W. Thus, the solidified body 7 is sublimated uniformly over the entire surface of the substrate W, and the gas-solid interface of the solidified body 7 moves in a direction perpendicular to the front surface of the substrate W. Since the gas-solid interface of the solidified body 7 moves in a direction perpendicular to, rather than parallel to, the front surface of the substrate W, the protrusions 9 of the pattern are not pulled by the movement of the gas-solid interface, whereby the front surface of the substrate W is dried well while the collapse of the pattern formed on the front surface of the substrate W is prevented.

While the embodiment according to the present invention has been described hereinabove, various modifications of the present invention in addition to those described above may be made without departing from the scope and spirit of the invention. For example, the processing liquid containing 1,1,2,2,3,3,4-heptafluorocyclopentane is used as the drying liquid in the aforementioned embodiment. The present invention, however, is not limited to this. It is only necessary that the drying liquid is a processing liquid containing a sublimable material. For example, the drying liquid may be deionized water or t-butanol. Deionized water may be used as the drying liquid because the solidified body (ice) of deionized water has the property of being sublimated by supplying nitrogen gas at approximately −60° C. thereto.

In the aforementioned embodiment, cold water is supplied to the back surface of the substrate W to solidify the liquid film 5 of the drying liquid. The present invention, however, is not limited to this. It is only necessary that a fluid at a temperature lower than the solidifying point of the sublimable material is supplied to the back surface of the substrate W to solidify the liquid film 5 of the drying liquid. For example, a cooled gas (e.g., nitrogen gas) may be supplied to the back surface of the substrate W to solidify the liquid film 5 of the drying liquid. When a gas is used as a coolant, a cooled gas may be directly supplied from the front surface side of the substrate W to the liquid film 5 of the drying liquid. However, the supply of a liquid as a coolant causes the solidification of the liquid film 5 more promptly because the heat capacity of a liquid is significantly greater than that of a gas. Further, the liquid film 5 of the drying liquid on the front surface of the substrate W may be solidified by a cooling mechanism such as a Peltier element provided in the spin base 23.

The nitrogen gas temperature-controlled at approximately 7° C. is blown as the drying gas onto the solidified body 7 in the sublimating step in the aforementioned embodiment. The drying gas, however, is not limited to nitrogen gas, but may be other types of gases. When the sublimable material is 1,1,2,2,3,3,4-heptafluorocyclopentane, the temperature of the drying gas may be within the range of 00 to 80° C. (that is, nitrogen gas at room temperature may be blown).

In the temperature controlling step, the process for temperature control is not limited to the supply of nitrogen gas at room temperature to the substrate W. The substrate W may be temperature-controlled at ambient temperature or above by a heater or light irradiation from a lamp.

Figure 9:
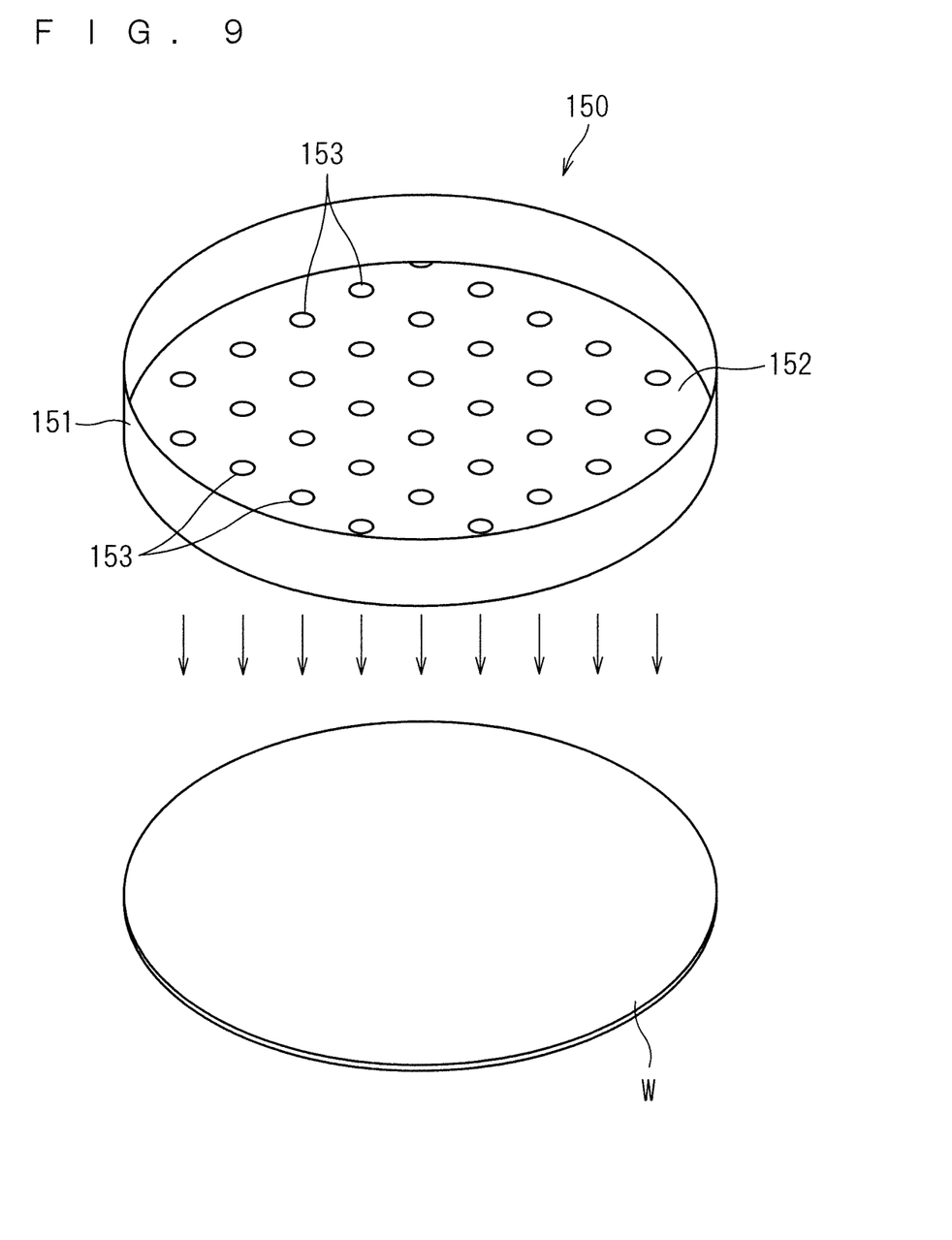
FIG. 9 is a view showing another example of the gas nozzle.

The gas nozzle for blowing nitrogen gas onto the solidified body 7 in the sublimating step may be a gas nozzle as shown in FIG. 9. A gas nozzle 150 shown in FIG. 9 includes a punched plate 152 having a multiplicity of openings 153 bored in a bottom surface of a housing 151 having a cylindrical shape. The disk-shaped punched plate 152 has a diameter greater than that of the substrate W. That is, the punched plate 152 of the gas nozzle 150 is provided in opposed relation to the entire surface of the substrate W held by the spin chuck 20.

Nitrogen gas temperature-controlled at a predetermined temperature is supplied from a nitrogen gas supply mechanism similar to that of the aforementioned embodiment into the interior space of the housing 151. The openings 153 are provided in the punched plate 152 at the bottom surface of the housing 151 so as to have an even aperture ratio. Thus, the nitrogen gas supplied to the interior of the housing 151 is uniformly ejected from the openings 153 of the punched plate 152. As a result, the nitrogen gas is supplied from the gas nozzle 150 so that the flow rate thereof per unit area is constant over the entire surface of the substrate W, as in the aforementioned embodiment. Functions and effects similar to those of the aforementioned embodiment are produced by blowing nitrogen gas from the gas nozzle 150 onto the solidified body 7 on the front surface of the substrate W in the sublimating step. Thus, the front surface of the substrate W is dried well while the collapse of the pattern formed on the front surface of the substrate W is prevented.

A plate provided with a plurality of ring-shaped concentric slits having different diameters may be disposed in place of the punched plate 152 provided with the openings 153. In short, it is only necessary to provide a gas nozzle configured to supply nitrogen gas so that the flow rate thereof per unit area is constant over the entire surface of the substrate W held by the spin chuck 20.

Also, a substrate becoming subject to the processes by the technique according to the present invention is not limited to a semiconductor wafer, but may be a glass substrate for use in a flat panel display for a liquid crystal display apparatus and the like, and a substrate for a solar cell.

INDUSTRIAL APPLICABILITY

The technique according to the present invention is advantageously applicable to a substrate drying method and a substrate drying apparatus which form a solidified body of a processing liquid containing a sublimable material on a front surface of a substrate such as a semiconductor wafer and supply a drying gas to the solidified body to sublimate the solidified body.

EXPLANATION OF REFERENCE SIGNS

1 Substrate drying apparatus
5 Liquid film
7 Solidified body
9 Protrusions
26
10 Chamber
20 Spin chuck
25 Lower processing liquid supply pipe
30 Processing liquid nozzle
50, 150 Gas nozzles
51 Central supply passage
52 Buffer space
53 Central orifice
54 Annular orifice
63 Deionized water supply part
64 Cooling unit
75 Drying liquid supply part
81 Nitrogen gas supply part
88 Temperature control unit
90 Controller
152 Punched plate
153 Openings
W Substrate

The invention claimed is:
1. A substrate drying method for removing a liquid adhering to a front surface of a substrate, comprising:
a supplying step for supplying a processing liquid containing a sublimable material to the front surface of said substrate to form a liquid film of said processing liquid;

a solidifying step for solidifying said liquid film of said processing liquid formed on the front surface of said substrate into a solid; and a sublimating step for supplying a drying gas to said solid formed on the front surface of said substrate to sublimate said solid, wherein said drying gas is supplied in said sublimating step so that $2\pi r:N$ is constant over an entire surface of said substrate where N is a total flow rate of said drying gas blown onto a circumference of a circle having a distance r from a center of said substrate, and a gas-solid interface moves in a direction perpendicular to the front surface of said substrate.

2. The substrate drying method according to claim 1, wherein
a fluid at a temperature lower than a solidifying point of said sublimable material is supplied to a back surface of said substrate to solidify said liquid film in said solidifying step.

3. The substrate drying method according to claim 1, further comprising
a temperature controlling step for increasing a temperature of said substrate to an ambient temperature or above after said solid is sublimated.

4. The substrate drying method according to claim 1, wherein
said sublimable material is 1,1,2,2,3,3,4-heptafluorocyclopentane.

5. A substrate drying apparatus for removing a liquid adhering to a front surface of a substrate, comprising:
a liquid supply part for supplying a processing liquid containing a sublimable material to the front surface of said substrate to form a liquid film of said processing liquid;
a solidified body forming part for solidifying said liquid film of said processing liquid formed on the front surface of said substrate into a solid; and
a gas supply part for supplying a drying gas to said solid formed on the front surface of said substrate to sublimate said solid, wherein said gas supply part supplies said drying gas so that $2\pi r:N$ is constant over an entire surface of said substrate where N is a total flow rate of said drying gas blown onto a circumference of a circle having a distance r from a center of said substrate, and a gas-solid interface moves in a direction perpendicular to the front surface of said substrate.

6. The substrate drying apparatus according to claim 5, wherein
said gas supply part includes
an annular orifice of a ring-shaped configuration for ejecting said drying gas toward a peripheral portion of said substrate in a spreading manner, and
a central orifice provided at a center of said annular orifice and for ejecting said drying gas toward a central portion of said substrate in a spreading manner.

7. The substrate drying apparatus according to claim 5, wherein
said gas supply part includes
a punched plate provided in opposed relation to the entire surface of said substrate and including a plurality of openings for ejecting said drying gas so as to have an even aperture ratio.

8. The substrate drying apparatus according to claim 5, wherein
said solidified body forming part supplies a fluid at a temperature lower than a solidifying point of said sublimable material to a back surface of said substrate to solidify said liquid film.

9. The substrate drying apparatus according to claim 5, further comprising
a temperature controlling part for increasing a temperature of said substrate to an ambient temperature or above after said solid is sublimated.

10. The substrate drying apparatus according to claim 5, wherein
said sublimable material is 1,1,2,2,3,3,4-heptafluorocyclopentane.

* * * * *